(12) United States Patent
Bailey

(10) Patent No.: US 8,436,647 B2
(45) Date of Patent: May 7, 2013

(54) PIPELINE POWER GATING FOR GATES WITH MULTIPLE DESTINATIONS

(75) Inventor: Daniel W. Bailey, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/335,104

(22) Filed: Dec. 22, 2011

(65) Prior Publication Data

US 2013/0009693 A1   Jan. 10, 2013

Related U.S. Application Data

(63) Continuation-in-part of application No. 13/176,842, filed on Jul. 6, 2011.

(51) Int. Cl.
   *G06F 7/38* (2006.01)
   *H03K 19/00* (2006.01)

(52) U.S. Cl.
   USPC .............................................. 326/40; 326/93

(58) Field of Classification Search .............. 326/37–47, 326/93–98, 101
   See application file for complete search history.

(56) References Cited

U.S. PATENT DOCUMENTS

| | | | |
|---|---|---|---|
| 4,980,836 A * | 12/1990 | Carter et al. | 713/322 |
| 7,295,036 B1 * | 11/2007 | Zaveri et al. | 326/38 |
| 7,323,909 B2 * | 1/2008 | Mamidipaka | 326/93 |
| 8,266,569 B2 * | 9/2012 | Palisetti et al. | 716/133 |
| 2005/0083081 A1 * | 4/2005 | Jacobson et al. | 326/93 |
| 2006/0226869 A1 * | 10/2006 | Chong | 326/33 |
| 2008/0088344 A1 * | 4/2008 | Mamidipaka | 326/93 |

OTHER PUBLICATIONS

Seomun, Jun, et al., "Synthesis and Implementation of Active Mode Power Gating Circuits," 47th ACM/IEEE Design Automation Conference '10, Jun. 13-18, 2010, pp. 487-492.
U.S. Appl. No. 13/176,842, filed Jul. 6, 2011, entitled "Pipeline Power Gating," and naming inventors Daniel W. Bailey, Aaron S. Rogers, James J. Montanaro, Bradley G. Burgess, and Peter J. Hannan.

* cited by examiner

*Primary Examiner* — Thienvu Tran
(74) *Attorney, Agent, or Firm* — Abel Law Group, LLP

(57) ABSTRACT

A first and second plurality of gates are coupled respectively between first and second source storage elements and first and second destination storage elements. The first and second plurality of gates are slept to reduce leakage current in the plurality of gates under certain conditions by turning off respective one or more transistors between the first and second plurality of gates and power supplies. A third plurality of gates are maintained in a reduced leakage current state (sleep state) or regular state (wake state) based on conditions associated with the source and destination elements for the first and second plurality of gates.

20 Claims, 8 Drawing Sheets

US 8,436,647 B2

PIPELINE POWER GATING FOR GATES WITH MULTIPLE DESTINATIONS

CROSS-REFERENCE TO RELATED APPLICATION(S)

This application relates to U.S. patent application Ser. No. 13/176,842, filed Jul. 6, 2011, entitled "Pipeline Power Gating," naming inventors Daniel W. Bailey et al., which application is incorporated herein by reference in its entirety.

BACKGROUND

1. Field of the Invention

This invention relates to power savings in integrated circuits and more particularly to reducing leakage current during runtime.

2. Description of the Related Art

Power consumption in integrated circuits can be attributed to both actively switching circuits and to idle circuits. Even when circuits are idle, leakage current from the transistors results in undesirable power consumption. Previous solutions to saving power have identified large architectural features that have been idle for a period of time and have implemented power savings in such circuits by reducing the voltage being supplied and/or the frequency of clock signals being supplied to the unused circuitry. For example, in a multi-core processor, one or more of the cores may be placed in a lower power consumption state by reducing the supplied frequency and/or voltage while maintaining active other functional blocks, such as input/output blocks. However, particularly in battery driven devices, such as mobile devices, laptops, and tablets, finding additional ways to save power is desirable to extend battery life, reduce heat generation, and ease cooling requirements. Even in desktop or server systems, reducing power consumption leads to reduced heat generation, cost savings by reducing electricity use, and reduced cooling requirements. Power saving considerations continue to be an important aspect of integrated circuit and system design.

SUMMARY OF EMBODIMENTS OF THE INVENTION

Additional power savings can be achieved by focusing on small-grained features of the integrated circuit. One embodiment provides a method of reducing leakage current that includes waking a first plurality of gates coupled between first source storage elements and second destination storage elements, to allow current flow in the first plurality of gates, the waking in response to assertion of any of one or more first source clock enable signals associated with the first source storage element. The method includes waking a second plurality of gates, coupled between second source storage elements and second destination storage elements plurality, to allow current flow in the second plurality of gates, in response to assertion of any of one or more second source clock enable signals associated with the second source storage elements. The method further includes waking a third plurality of gates, in response to assertion of any of the one or more first source clock enable signals and waking the third plurality of gates in response to the assertion of the any of the one or more second source clock enable signals. The third plurality of gates are slept to reduce leakage current in the third plurality of gates in response to, at least in part, all of the one or more first and second source clock enable signals being deasserted.

In another embodiment, an apparatus includes a plurality of first power-gated gates coupled between first source storage elements and first destination storage elements. A plurality of second power-gated gates are coupled between second source storage elements and second destination storage elements. A plurality of third power-gated gates are coupled between at least one of the first or second source storage elements and the first and second power-gated gates. At least one power gate is coupled in series between a power supply node and the third power-gated gates, the power gate to reduce current flow through the third power-gated gates in response to a power gate control signal indicating a sleep state and to allow current flow through the power-gated gates in response to the power gate control signal indicating a wake state. Control logic for the at least one power gate is configured to cause the power gate control signal to indicate the wake state based on first and second control signals associated with the first and second power gated gates that respectively cause the first and second power-gated gates to enter sleep and wake states.

BRIEF DESCRIPTION OF THE DRAWINGS

The present invention may be better understood, and its numerous objects, features, and advantages made apparent to those skilled in the art by referencing the accompanying drawings.

The use of the same or similar reference symbols in different drawings indicates similar or identical items.

DETAILED DESCRIPTION

Power gating groups of gates achieves additional power savings during run-time operation by reducing the leakage current of transistors in the gates. In one embodiment a power gate is formed by a transistor (or many transistors in parallel) that are in series between the power-gated gates and their power supplies, e.g., VDD and/or GND. The power gate(s) are then selectively controlled to disconnect the gates from VDD and/or ground so the leakage current can be reduced when the gates are not being used.

Figure 1:
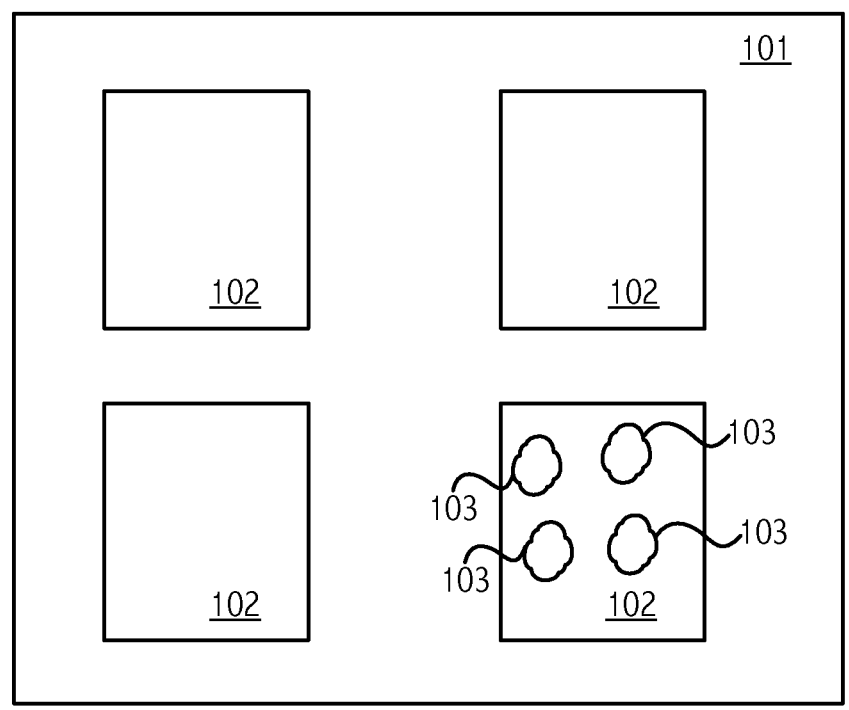
FIG. 1 shows a high level diagram of an integrated circuit suitable for using embodiments of the invention.

Referring to FIG. 1, a high-level block diagram illustrates an integrated circuit 101 such as a microprocessor, which includes multiple macro architectural features 102 such as processing cores, whose power can be controlled by placing them in power states that provide varying levels of performance, from a sleep state to a fully powered state. In addition, one or more of the macro architectural features have groups of gates 103 that can be controlled to reduce power consumption during the full (or a reduced) operational state during run time.

Figure 2:
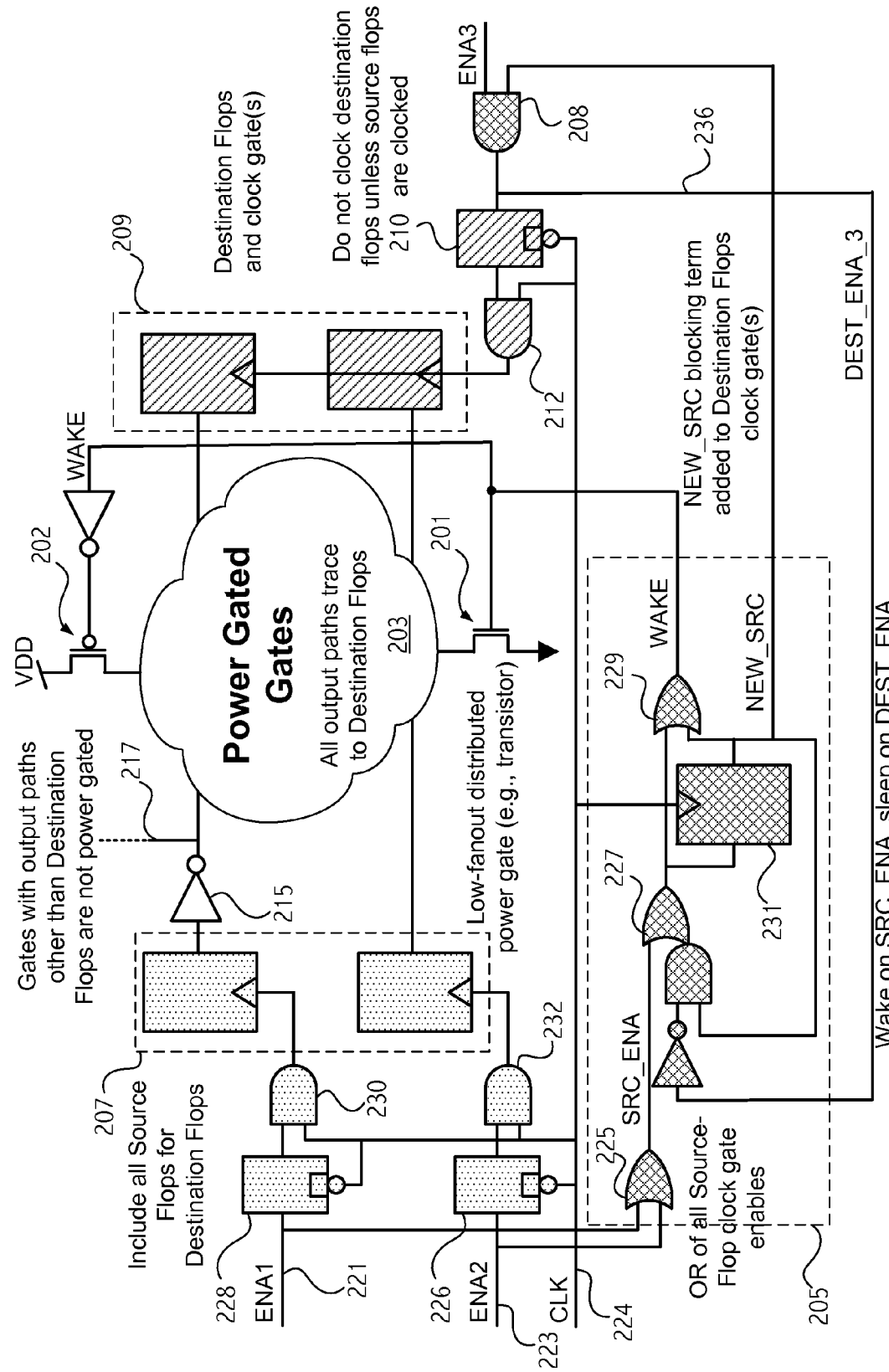
FIG. 2 illustrates a high level diagram of power-gating logic gates according to an embodiment of the invention

FIG. 2 illustrates an exemplary embodiment of how the groups of gates can be controlled during run time to decrease power consumption. Referring to FIG. 2, nFET power gate 201 is in series between the power-gated gates 203 and GND. The power-gated gates 203 correspond to the group of gates 103 shown in FIG. 1. The gates that are power gated are typically AND, OR, NOR, NAND, and similar logic gates and are represented in FIG. 2 as power-gated gates 203. When the gates 203 are idle, the power gate 201 can be turned off, reducing the voltage across the gates and thereby reducing the leakage current from the gates. In addition, or instead of using the nFET 201, a pFET 202 can be used in series with VDD, and switched off to reduce the voltage across the gates, thereby reducing the leakage current.

A significant issue with run-time power gating is having adequate time to transition the gates from sleeping to fully powered, i.e., having enough time to wake. That is, when power gate 201 is turned on, the power-gated gates take time to fully charge to their fully powered state in response to power gate 201 (and/or 202) turning on. One approach is to include sufficient timing margin in the design, e.g., a guard band in the timing design, to ensure the gates are fully powered. However, such a timing penalty is generally unacceptable in high-performance integrated circuits such as microprocessors.

Control logic 205 monitors the clock gate enables 221 and 223 of the source flip-flops 207 to determine when to wake, and when to sleep the power-gated gates. The number of clock gate enables shown is illustrative and other numbers of enables may be utilized based on design requirements. Note that the AND gate 208 may also be considered part of control logic 205 and helps control the clocking of the destination flip-flops as described further herein. Note that while flip-flops are shown in FIG. 2, any source and destination storage elements, such as latches, may be used instead of, or in addition to, the flip-flops shown in FIG. 2.

FIG. 2 illustrates the basic operation and construction of an exemplary embodiment. A chosen set of destination flip-flops 209 determines the set of gates 203 that can be power gated. That is, a gate can be power gated if all of its output paths terminate exclusively at one or more of the destination flip-flops 209. Gates with output paths that go to places other than destination flip-flops are not power gated. For example, the inverter 215 has an output path 217 that goes somewhere other than destination flip-flops 209, e.g., to a different flip-flop, latch, or output port. Accordingly, inverter 215 is not included as part of the power-gated gates 203. In an exemplary embodiment the control logic 205 is a state machine that controls the power gate, monitors the clock gate enables and determines when to wake the power-gated gates, and when the power-gated gates can sleep.

Figure 3:
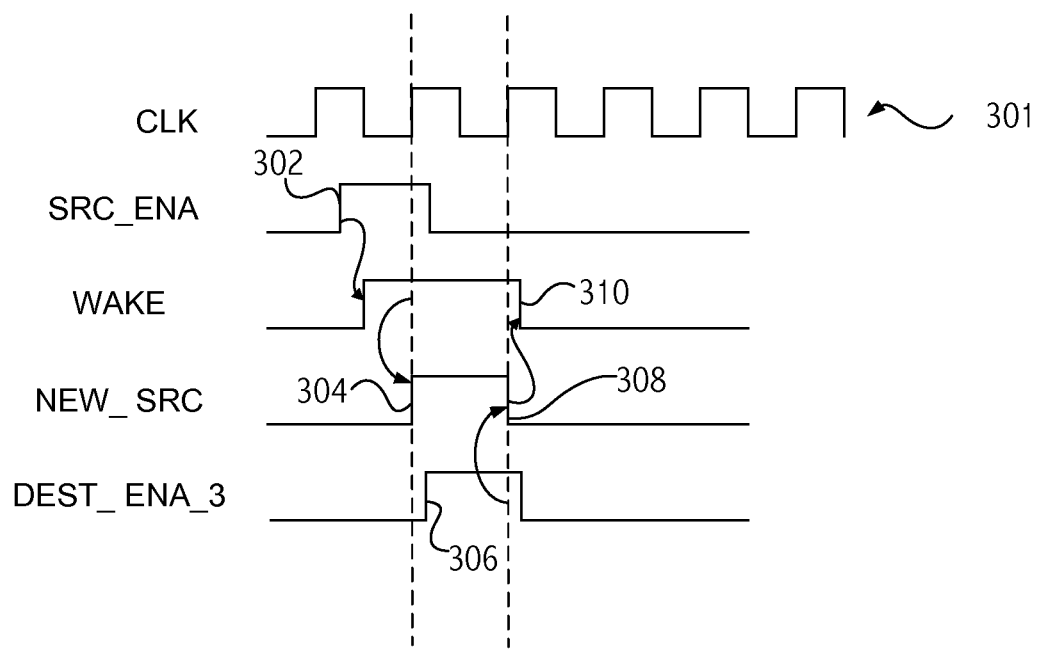
FIG. 3 illustrates a timing diagram associated with the embodiment of FIG. 2.

Consider an initial state of sleep. In the initial sleep state shown in FIG. 2, destination flip-flops 209 are blocked from clocking and the power-gated gates 203 are sleeping. The term sleeping refers to the power gate 201 (or 202) being turned off to reduce leakage current in the power-gated gates 203. In the sleeping state the state machine in the control logic 205 is in a first state in which the WAKE signal is deasserted. FIG. 3 illustrates a timing diagram associated with the circuits shown in FIG. 2. The term "wake" refers to the power gate 201 (and/or 202) being turned on to allow current to flow in the power-gated gates 203.

Referring to FIG. 3, assume a clock signal CLK 301 on clock signal line 224. Latches 226 and 228 are used to supply the enable signals ENA1 221 and ENA2 223 for the clock signals for source flip-flops 207. The enable signals are ANDed with the clock signals in AND gates 230 and 232. Gates 203 wake in response to assertion of any of the source flip-flop clock gate enables 221 or 223 (shown at 302) after the delay through OR gates 225, 227, and 229. The state machine flip-flop 231 asserts its output on the rising edge of the next cycle at 304, thus changing to a second state. The assertion of the output of the flip-flop 231 results, after a delay, in the assertion of the DEST_ENA_3 signal at the output of the AND gate 208 at 306. The destination flip-flops 209 are then clocked after the delay through latch 210 and AND gate 212. The enable (ENA3) for the destination flip-flops is assumed to be asserted at that time. Using the state machine, there is at least a one-cycle delay between assertion of the source enables at 302 and the assertion of the destination enable at 306, allowing the power-gated gates time to fully charge before the destination flip-flop clocks are unblocked and clocked.

The power-gated gates 203 are held awake by the control logic 205 until the destination flip-flops are clocked. Once destination flip-flops are clocked after DEST_ENA_3 236 is asserted at 306 and the source enables 221 and 223 are deasserted, the output of the state machine flip-flop deasserts at 308 at the rising clock edge, returning to the first state, causing the power-gated gates to sleep by deassertion of the WAKE signal at 310. Any further clocks for the destination flip-flops 209 are blocked by AND gate 208 until source flip-flops are clocked again. The destination flip-flops will not change, of course, if the source flip-flops do not change. The blocking function allows a full clock period before destination flip-flop inputs are consumed.

An embodiment may have multiple destination enables. If so, there is a need to wait until all destination clock enable signals have asserted before putting the power-gated gates to sleep. Since conceivably the destination enables can arrive at different times, the signals can be stored in flip-flops and then reset when all bits have been asserted at least once and supplied to the logic to cause sleep through the flip-flop 231. In an embodiment, bits could be encoded to save on the number of flip-flops.

Figure 4A:
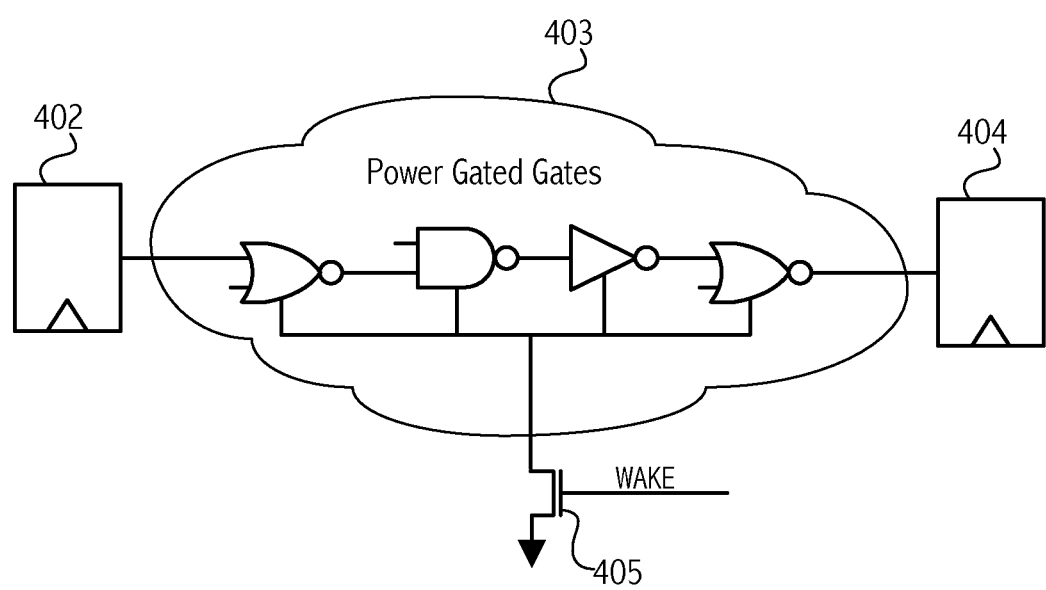
FIG. 4A illustrates an exemplary power-gating approach.
Figure 4B:
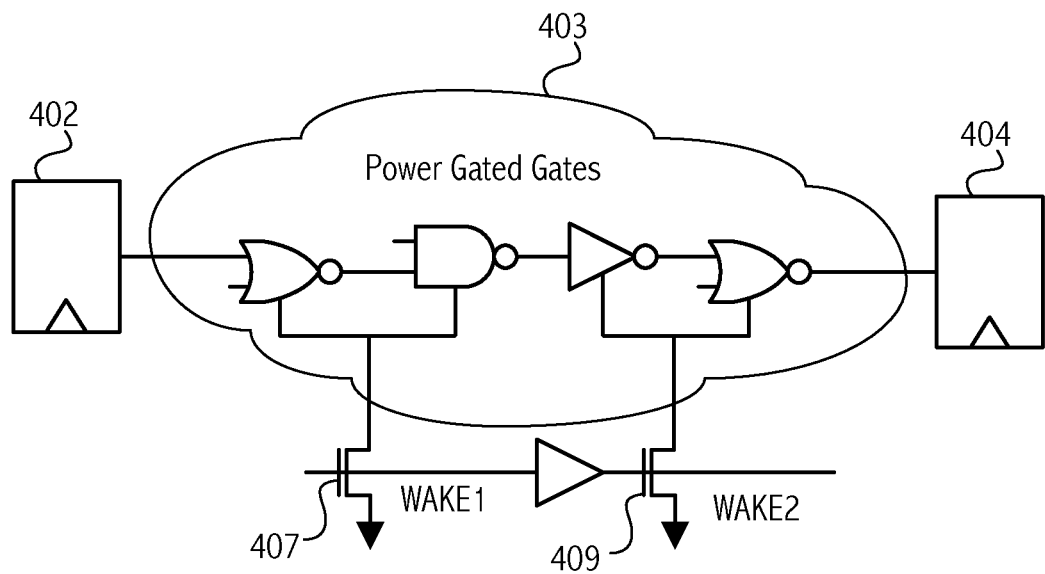
FIG. 4B illustrates an exemplary power-gating approach utilizing additional power gates.

FIG. 4A illustrates an embodiment in which the power-gated gates 403 between source flip-flop 402 and destination flip-flop 404 are coupled to a single power gate 405. In FIG. 4B multiple power gates 407 and 409 are used. If there are a large number of power-gated gates, the distribution of WAKE to the power gates may take several stages of buffers. FIG. 4B shows how timing requirements can be relaxed by partitioning gates into critical timing gates (attached to WAKE1) and non-critical timing gates (attached to WAKE2). Thus, power gate 407 receives WAKE1 and power gate 409 receives WAKE2. Gates temporally closest to the source flip-flops are most critical. In the embodiment shown in FIG. 4B, the power gate for the critical gates receive WAKE1 using no buffers (or fewer buffers) as compared to WAKE2. For ease of illustration, WAKE2 is shown being generated with one buffer and WAKE1 with no buffers. Other number of buffers may be required depending on the particular implementation and the number of power gates driven by each of the wake signals.

Timing requirements are aggressive, but can be relaxed. The OR of the enables of the source flip-flops supplies the state machine flip-flop 231. The clock for the flip-flop 231 can be delayed, however, since it initiates the sleeping function, not the waking.

Figure 4C:
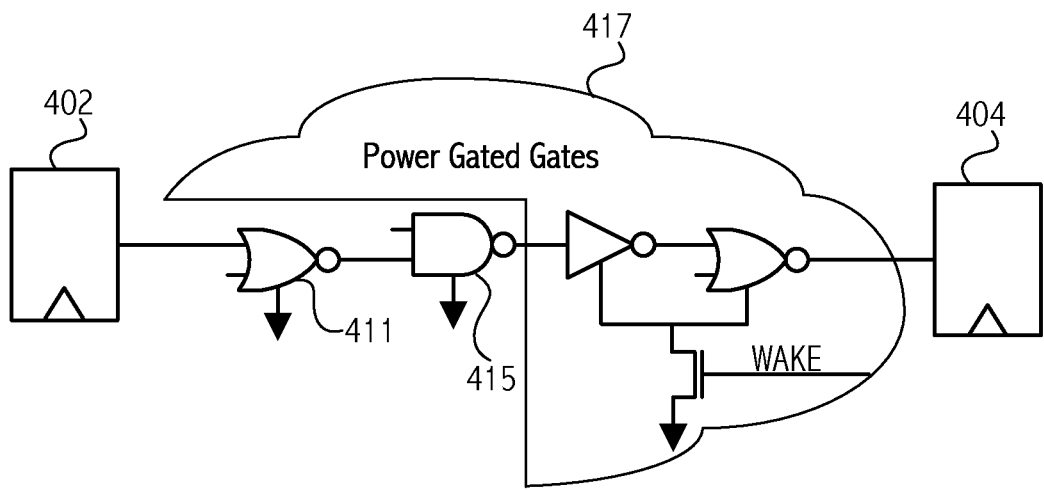
FIG. 4C illustrates a high level diagram of an exemplary power-gating power approach in which timing constraints are eased by eliminating gates from being power gated.

A second timing constraint is that the gates should be fully powered by the time they are used, or timing can suffer. They should be wakened by the time the source flip-flops outputs can transition. This timing constraint can be relaxed by not power gating stages of gates immediately following the source flip-flops. Referring to FIG. 4C, gates 411 and 415 are not power gated and not included with power-gated gates 417 to provide additional timing margin for the control signal WAKE to wake the power-gated logic gates. Both of these timing relaxation techniques shown in FIGS. 4B and 4C reduce the leakage savings. As shown in FIG. 4C, the setup requirement can be relaxed by trading off coverage of how many gates are subject to power gating.

The active power gating approach described herein is applicable to microprocessor design, but is widely applicable to circuit design generally. Because the techniques herein can be generally applied to digital circuitry, the active power gating described herein can achieve high coverage, which in turn means more power savings. Timing impact is modest. The timing impact results from a term being ANDed in AND gate 208 in the clock enable path, and there is additional load for the one or more source enable signals from the OR tree. As clock gating efficiency improves over current approaches, the active power gating herein will automatically improve in terms of its impact on leakage savings.

Power gating described herein may lead to higher use of LowVT (LVT) gates, or even UltraLowVT (ULVT) gates, within power-gated domains because leakage power is selectively and transiently reduced. Active-mode power gating puts leakage power on par with dynamic power when making performance-power tradeoffs.

An additional benefit of the approach described in FIG. 2 is that dynamic power is likely to be reduced, too, because of the clock blocking function by AND gate 208 on the clock for the destination flip-flops. That is, if the destination clocks are blocked by the control logic 205, additional power savings occurs.

As has been described above, pipeline Power Gating (PPG) reduces leakage of inactive circuits during run time. In certain embodiments, it is possible to increase the logical coverage of PPG while preserving the original power savings so that leakage savings is increased.

Figure 5:
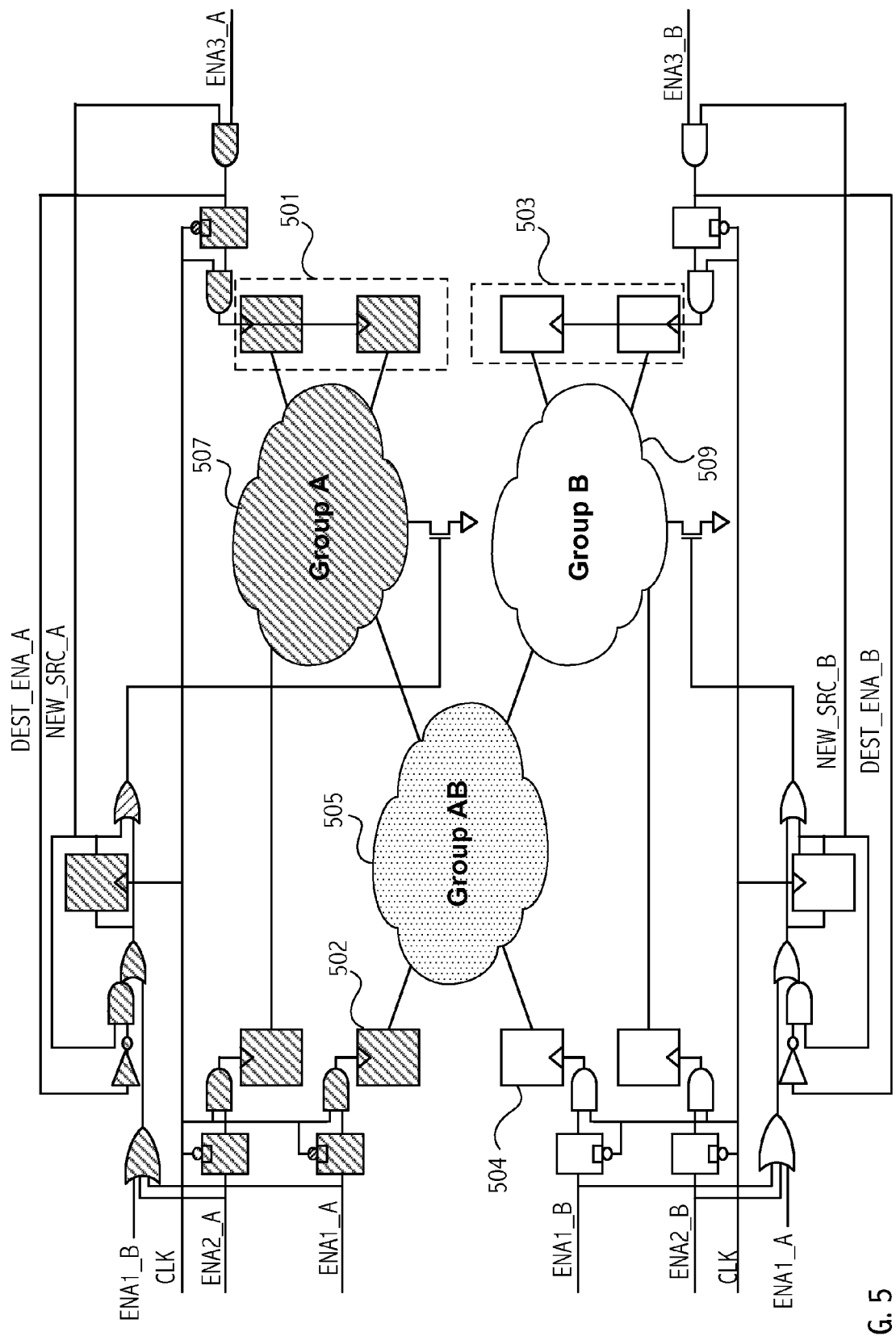
FIG. 5 illustrates a configuration in which gates in Group A and gates in Group B are power gated and gates in Group AB are not power gated.

Referring to FIG. 5, consider the illustrated configuration in which gates in Group A supplying destination flip-flops 501 and gates in Group B supplying destination flip-flops 503 are power gated. Gates in Group AB are not power gated because they terminate in more than one set of destinations, both Group A destination flip-flops and Group B destination flip-flops. Group AB gates must be awake anytime either Group A or Group B destination flops are clocked.

Another important concern is that power-gated domain outputs must not drive fully powered gates without isolation gates. The consequence would be crossover current and possible compromise of reliability. An isolation gate is a gate that is configured to selectively ignore an input, and requires a full-rail signal to control it. For Group A and Group B gates, the isolation gates are the destination flops, and the isolation controls are the clocks. Adding isolation gates to the outputs of Group AB gates would impact timing if generally applied.

Figure 6:
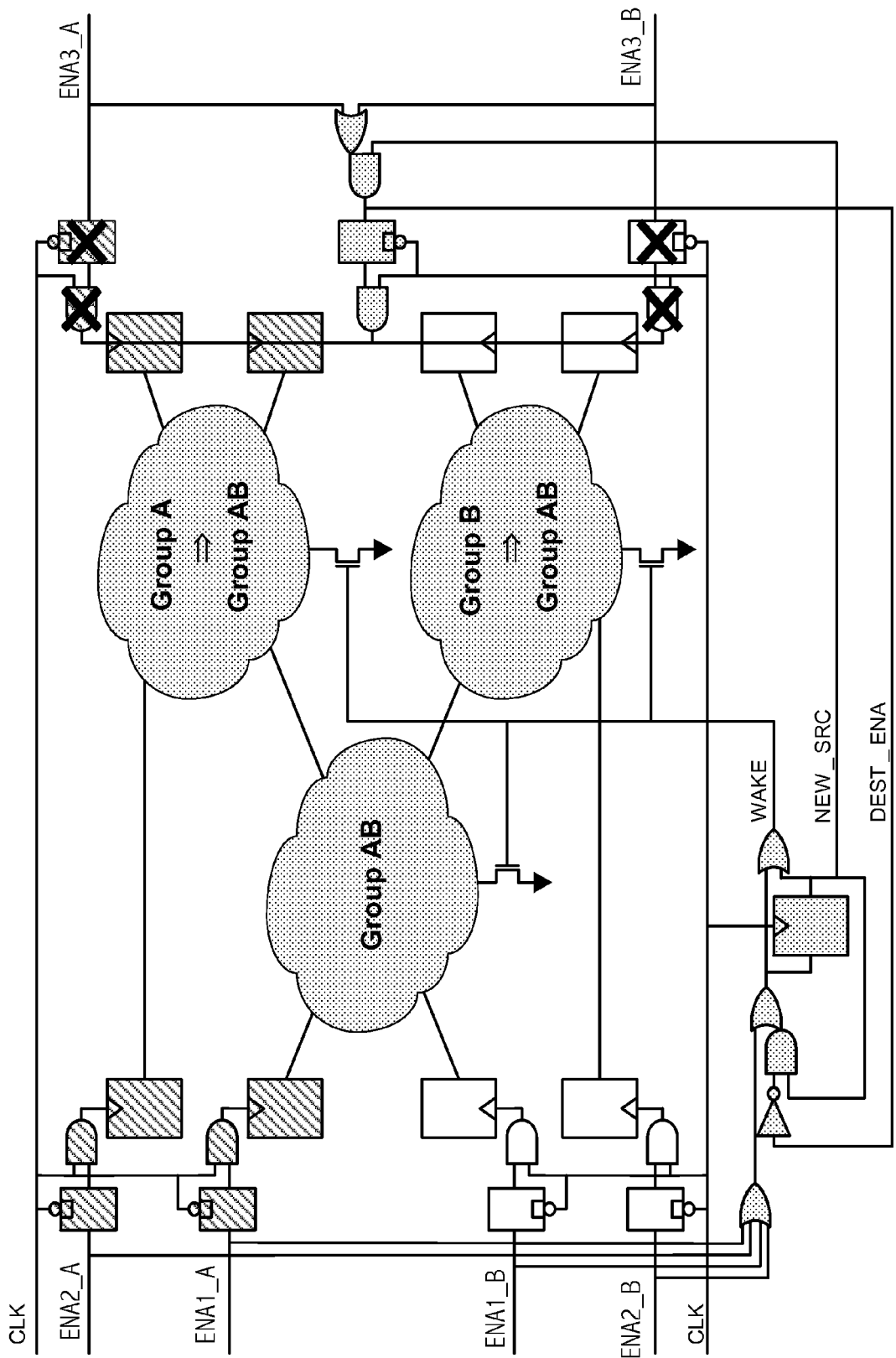
FIG. 6 illustrates a configuration in which logical coverage is increased over the configuration of FIG. 5.

As shown in FIG. 6, logical coverage can be increased by combining the multiple sets of destination flip-flops into a single set of destination flops. As shown in FIG. 6, groups of gates A and B are subsumed into a larger Group AB. The circuit shown in FIG. 6 increases the logical coverage, but the main problem with this approach is that static and dynamic power savings may actually be reduced. Group A gates are now likely to be slept less often than in the original configuration since they are awakened by any of the Group A and Group B source enables. Similarly, dynamic power is likely to increase because Group A destination flops are clocked when either ENA3_A or ENA3_B is asserted, instead of just ENA3_A. The same static and dynamic disadvantages apply to Group B gates.

In addition, there are two other problems with the approach shown in FIG. 6. First, it is unclear which group of gates should be combined when there are more than two sets of destinations. Consider if there are also Group C, AC, BC, and ABC gates. If all groups are subsumed into a Group ABC, then the power savings problem described above is worse. If Group AB is formed, then Groups AC, BC, and ABC are not included in the logical coverage (without duplication of logic). The second problem is that the register transfer language (RTL) description must be rewritten to restructure the logic as groups are combined.

Figure 7:
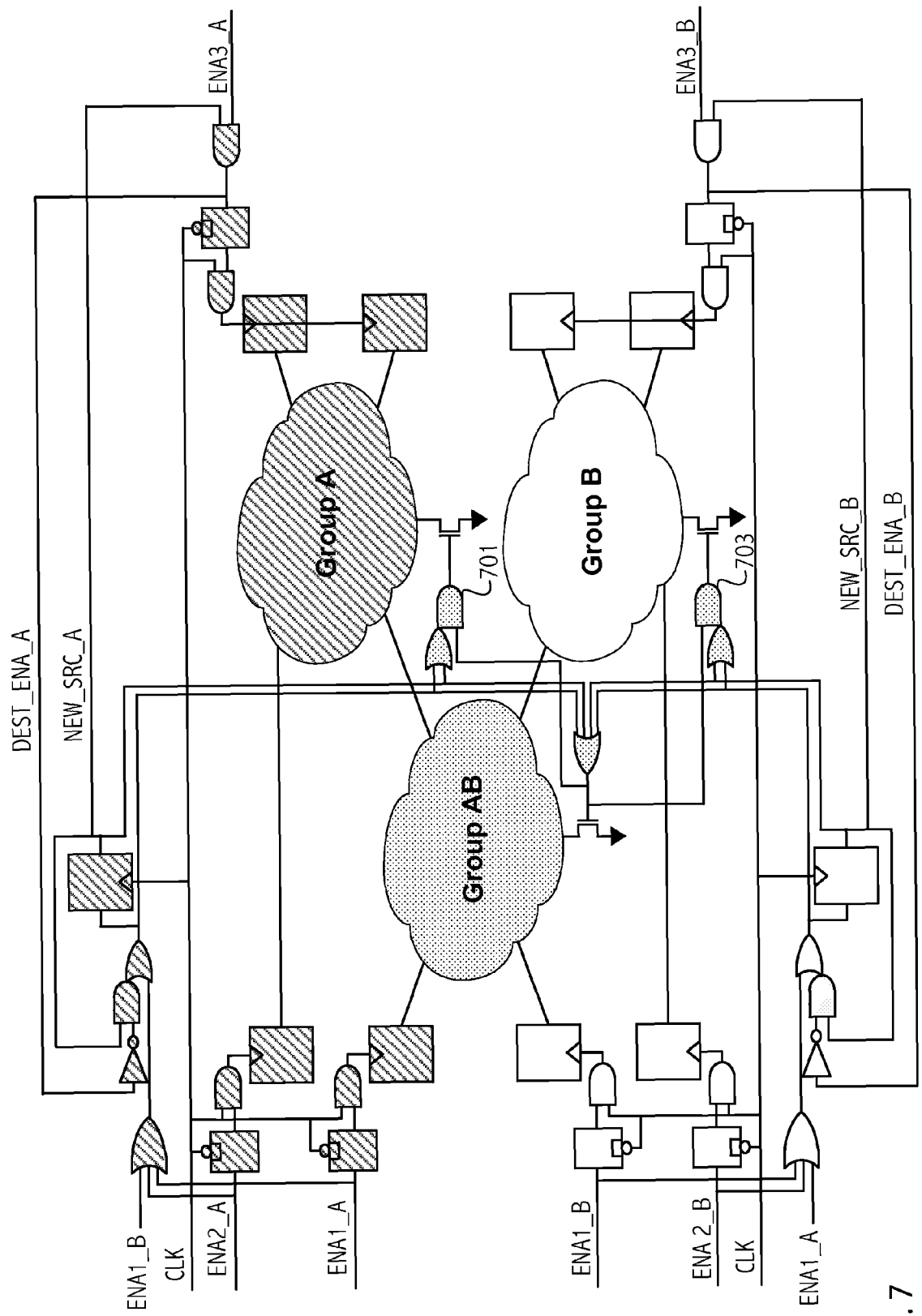
FIG. 7 illustrates another configuration for multiple groups providing improved logical coverage as compared to the configuration of FIG. 5 and improved power savings compared to the configuration of FIG. 6.

FIG. 7 shows an exemplary approach for combining power-gated groups that provides improved logical coverage and power savings. Unlike the circuit in FIG. 6, in FIG. 7 Group A and Group B gates are power gated as often as they are in the original configuration in FIG. 5. Also, Group A and Group B destination flip-flops are clocked as often as they are in the original configuration. Therefore, in FIG. 7, Group AB gates add to the leakage savings. In this approach, anytime either Group A or Group B gates are awake, Group AB gates are also woken. The function of the AND gate 701 driving the Group A power gate is to ensure Group AB gates are awake before Group A gates are woken, i.e., the AND is for power deracing. The same principle applies to the AND gate 703 driving the Group B power gate.

The approach described by FIG. 7 provides another advantage in that the formation of any groups does not prevent the formation of other groups. If there are also Group C, AC, BC, and ABC gates, they can all be power gated separately using similar logic.

Note that the preferred approach reduces timing margin by adding an AND gate delay in the power gate enable path. Also, the register transfer language (RTL) description of the circuit has to be updated as combined groups are added. But the approach of FIG. 7 increases the logical coverage and leakage savings from Pipeline Power Gating without decreasing the dynamic power savings, and the approach is scalable for all combinations of groups.

Figure 8:
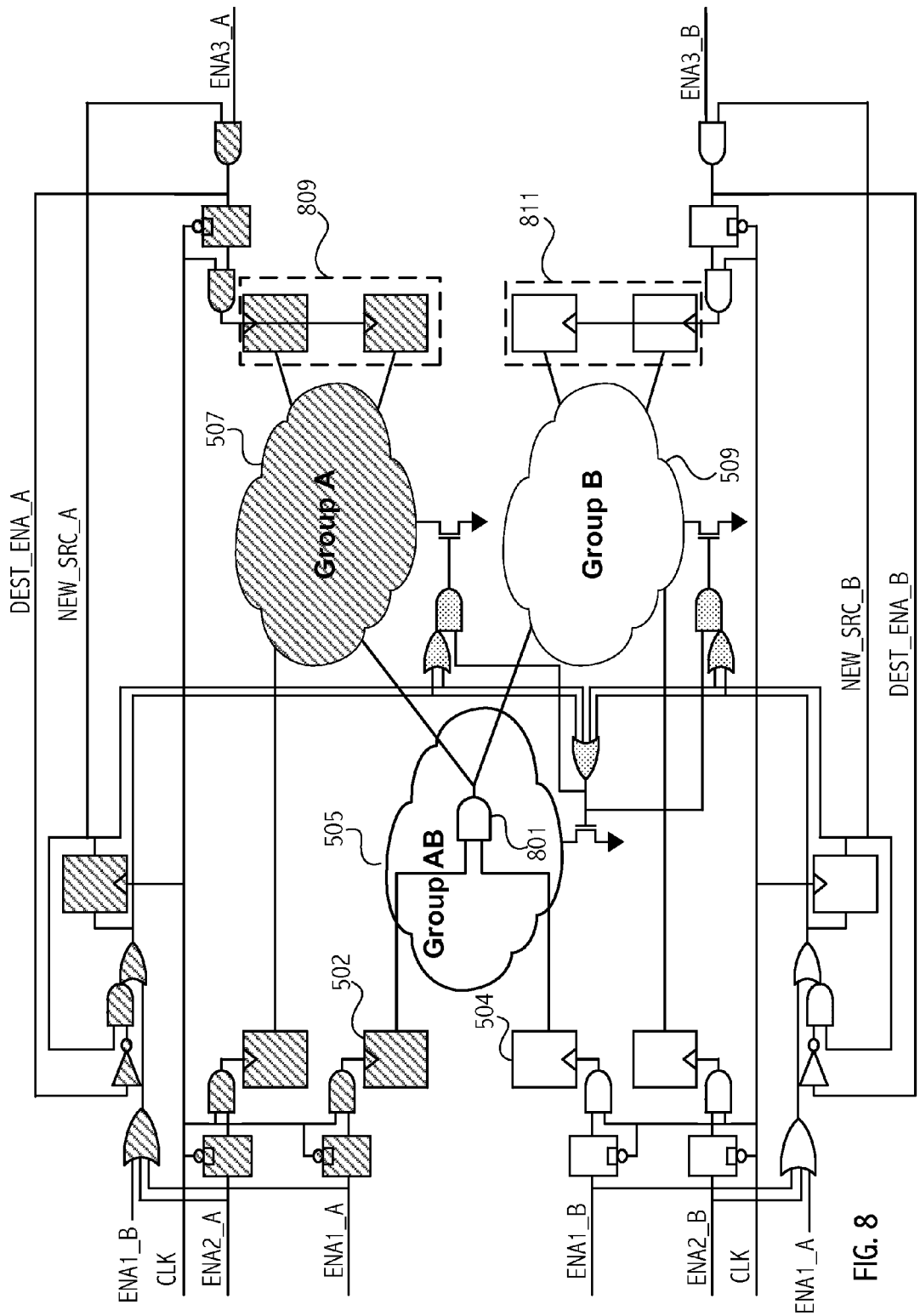
FIG. 8 illustrates additional details of Group AB found in one embodiment.

FIG. 8 illustrates an embodiment in which flip-flops 502 and 504 supply AND gate 801 in Group AB. Other logic gates are typically included in Group AB but FIG. 8 only shows AND gate 801 for ease of illustration. As can be seen in FIGS. 5-8, source storage element 502 is a source element for both Group A and Group B through the combinational logic in Group AB. Similarly, source storage element 504 is a source element for both Group A and Group B supplied through combinational logic in Group AB. Thus, source storage elements such as flip-flops 502 and 504 may serve as source storage elements for different groups of destination storage elements 809 and 811. Thus, assertion of either of the clock enable signals ENA1_B or ENA1_A wakes both Group A and Group B (and Group AB). The power savings can be seen in that Group A can remain power gated when ENA2_B is asserted and Group B can remain power gated when ENA2_A is asserted. Group AB is wakened whenever any of the enables for Group A or Group B are asserted. Thus, Group AB can be slept when both Group A and Group B are slept, saving power as compared to FIG. 5. In addition, Group A can be slept when Group AB and B are awake and Group B can be slept when Group A and AB are awake, thus providing power savings as compared to FIG. 5 or 6.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and computer-readable medium having encodings thereon (e.g., HDL, Verilog, GDSII data) of such circuits, systems, and methods, as described herein. Computer-readable medium includes tangible computer readable medium e.g., a disk, tape, or other magnetic, optical, or electronic storage medium. In addition to computer-readable medium having encodings thereon of circuits, systems, and methods, the computer-readable media may store instructions as well as data that can be used to implement the invention. Structures described herein may be implemented using software executing on a processor, firmware executing on hardware, or by a combination of software, firmware, and hardware.

The description of the invention set forth herein is illustrative, and is not intended to limit the scope of the invention as set forth in the following claims. Other variations and modifications of the embodiments disclosed herein may be made based on the description set forth herein, without departing from the scope and spirit of the invention as set forth in the following claims.

What is claimed is:

1. A method of reducing leakage current comprising:
    waking a first plurality of gates coupled between first source storage elements and second destination storage elements, to allow current flow in the first plurality of gates, in response to assertion of any of one or more first source clock enable signals associated with the first source storage elements;
    waking a second plurality of gates coupled between second source storage elements and second destination storage elements plurality, to allow current flow in the second plurality of gates, in response to assertion of any of one or more second source clock enable signals associated with the second source storage elements; and
    waking a third plurality of gates, in response to assertion of any of the one or more first source clock enable signals and waking the third plurality of gates in response to the assertion of the any of the one or more second source clock enable signals; and
    sleeping the third plurality of gates to reduce leakage current in the third plurality of gates in response to, at least in part, all of the one or more first and second source clock enable signals being deasserted.

2. The method as recited in claim 1 wherein the third plurality of gates are slept, at least in part, based on control signals respectively controlling sleep and wake states for the first and second plurality of gates.

3. The method as recited in claim 1 wherein one or more of the first source storage elements and one or more of the second storage elements are common.

4. The method as recited in claim 1 wherein one or more of the first source clock enable signals are common with one or more of the second source clock enable signals.

5. The method as recited in claim 1 wherein at least one of the third plurality of gates are coupled between one of the second source storage elements and the first and second plurality of gates.

6. The method as recited in claim 1 wherein waking the third plurality of gates comprises supplying a power gate control signal at a first value to at least one power gate coupled between the third plurality of gates and a supply voltage to turn on the power gate and enable current flow through the third plurality of gates and sleeping the third plurality of gates comprises supplying the power gate control signal at a second value to the at least one power gate to turn off the power gate and inhibit current flow through the third plurality of gates.

7. The method as recited in claim 1 further comprising:
    waking the third plurality of gates before waking the first plurality of gates in response to assertion of any of the one or more first source clock enable signals.

8. An apparatus comprising:
    a plurality of first power-gated gates coupled between first source storage elements and first destination storage elements;
    a plurality of second power-gated gates coupled between second source storage elements and second destination storage elements;
    a plurality of third power-gated gates, coupled between at least one of the first or second source storage elements and the first and second power-gated gates;
    at least one power gate coupled in series between a power supply node and the third power-gated gates, the power gate to reduce current flow through the third power-gated gates in response to a power gate control signal indicating a sleep state and to allow current flow through the power-gated gates in response to the power gate control signal indicating a wake state; and
    control logic is configured to cause the power gate control signal to indicate the wake state based on first and second control signals associated with the first and second power gated gates that respectively cause the first and second power-gated gates to enter sleep and wake states.

9. The apparatus as recited in claim 8 wherein the control logic provides a logical OR of first control signals that causes the first power-gated gates to enter or remain in the wake state and second signals that cause the second power-gated gates to enter or remain in the wake state.

10. The apparatus as recited in claim 8 further comprising:
    one or more first power gates coupled in series between the power supply node and the first plurality of power-gated gates, the first power gates to reduce current flow through the first plurality of power-gated gates in response to a first power gate control signal indicating the sleep state and to allow current flow through the first power-gated gates in response to the first power gate control signal indicating the wake state;
    first control logic coupled to receive one or more first source clock enable signals that enable clocking one or more of the first source storage elements, and to receive at least one first destination clock enable signal, the first control logic configured to cause the first power gate control signal to indicate the wake state in response to assertion of any of the first source clock enable signals, and wherein the first control logic is further configured to cause the first power gate control signal to indicate the sleep state only after all of the one or more of the first source clock enable signals are deasserted and the first destination clock enable signal has been asserted thereby allowing the first destination storage elements to be clocked to consume values supplied by the first power-gated gates.

11. The apparatus as recited in claim 10 wherein the first control logic includes a first state machine responsive to any of the first source enables being asserted to assert a first new source enable control signal in a first state of the state machine indicating one or more of the source enables are enabled and to deassert the first new source enable in a second state of the first state machine in response to all the enables of the first source storage elements being deasserted and the at least one first destination clock enable signal being asserted, and to deassert the first power gate control signal for the first power gate only after entering the second state of the state machine.

12. The apparatus as recited in claim 10 further comprising:
   one or more second power gates coupled in series between the power supply node and the second plurality of power-gated gates, the second power gates to reduce current flow through the second plurality of power-gated gates in response to a second power gate control signal indicating the sleep state and to allow current flow through the second power-gated gates in response to the second power gate control signal indicating the wake state;
   second control logic coupled to receive one or more second source clock enable signals that enable clocking one or more of the second source storage elements, and to receive at least one second destination clock enable signal, the second control logic configured to cause the second power gate control signal to indicate the wake state in response to assertion of any of the second source clock enable signals, and wherein the second control logic is further configured to cause the second power gate control signal to indicate the sleep state only after all of the one or more of the second source clock enable signals are deasserted and the second destination clock enable signal has been asserted thereby allowing the second destination storage elements to be clocked to consume values supplied by the second power-gated gates.

13. The apparatus as recited in claim 12 wherein the second control logic includes a second state machine responsive to any of the second source enables being asserted to assert a second new source enable control signal in a second state of the state machine indicating one or more of the source enables are enabled and to deassert the second new source enable in a second state of the second state machine in response to all the enables of the second source storage elements being deasserted and the at least one second destination clock enable signal being asserted, and to deassert the second power gate control signal for the second power gate only after entering the second state of the state machine.

14. The apparatus as recited in claim 12 wherein the logic for the power gate control signal is configured to generate the power gate control signal utilizing first signals from the first control logic that are used to generate the first power gate control signal and second signals from the second control logic that are used to generate the second power gate control signal.

15. The apparatus as recited in claim 12 wherein the first power gate control signal and the second power gate control signal are generated using the power gate control signal.

16. The apparatus as recited in claim 12 wherein the third power-gated gates are controlled to wake before the first power-gated gates wake when the third power gated gates wake in response to assertion of one or more of the first source clock enable signals.

17. The apparatus as recited in claim 12 wherein the third power-gated gates are controlled to wake before the second power-gated gates wake when the second power gated gates wake in response to assertion of one or more of the second source clock enable signals.

18. The apparatus as recited in claim 8 wherein the at least one power gate is an NMOS transistor in series between the third power-gated gates and ground.

19. The apparatus as recited in claim 8 wherein the at least one power gate is a PMOS transistor in series between the third power-gated gates and a supply voltage.

20. A tangible computer-readable medium storing a computer readable representation of an integrated circuit, the computer readable representation comprising a representation of:
   a plurality of first power-gated gates coupled between first source storage elements and first destination storage elements;
   a plurality of second power-gated gates coupled between second source storage elements and second destination storage elements;
   a plurality of third power-gated gates, coupled between at least one of the first or second source storage elements and the first and second power-gated gates;
   at least one power gate coupled in series between a power supply node and the third power-gated gates, the power gate to reduce current flow through the third power-gated gates in response to a power gate control signal indicating a sleep state and to allow current flow through the power-gated gates in response to the power gate control signal indicating a wake state; and
   logic for the at least one power gate to cause the power gate control signal to indicate the wake state based on control signals associated with the first and second power gated gates entering sleep and wake states.

* * * * *